United States Patent [19]
Hahn et al.

[11] 3,946,378
[45] Mar. 23, 1976

[54] DYNAMIC DIGITAL PULSE DISPLAY

[75] Inventors: Güenter Hahn, Boeblingen; Hans Hermann Lampe, Herrenberg; Peter Rudolph, Schoenaich, all of Germany

[73] Assignee: International Business Machines Corporation, Armonk, N.Y.

[22] Filed: Oct. 18, 1974

[21] Appl. No.: 515,950

[30] Foreign Application Priority Data
Nov. 9, 1973 Germany............................ 2355994

[52] U.S. Cl........ 340/324 M; 324/122; 340/166 EL
[51] Int. Cl.²............................................ G08B 5/36
[58] Field of Search ...... 340/324R, 324 M, 166 EL; 324/96, 122

[56] References Cited
UNITED STATES PATENTS

| | | | |
|---|---|---|---|
| 2,817,815 | 12/1957 | Evans................................. | 324/122 |
| 2,818,531 | 12/1957 | Peek ................................ | 324/122 X |
| 3,263,225 | 7/1966 | Headle .......................... | 340/324 M |
| 3,634,849 | 1/1972 | Nishizawa et al............ | 340/166 EL |
| 3,816,822 | 6/1974 | Auchaft.......................... | 324/122 X |
| 3,818,483 | 6/1974 | Yamauchi et al.............. | 340/324 R |

*Primary Examiner*—David L. Trafton
*Attorney, Agent, or Firm*—Joseph J. Connerton

[57] ABSTRACT

An arrangement for the dynamic direct display of pulses in the nanosecond range operates without oscilloscopes or other special display apparatus. To display pulse timing or amplitude characteristics, a pulse sequence is applied to an equidistant tapped delay line, the output from each tap being connected to a bistable storage element with an indicator lamp in the output. A plurality of indicator lamps are arranged in the form of a matrix. If a pulse occurs on a tap during a sampling interval, the associated indicator lamp is turned on. The sequence and identity of the turned on indicators is indicative of the pulse spacing and the pulse width in the pulse sequence.

8 Claims, 4 Drawing Figures

DYNAMIC DIGITAL PULSE DISPLAY

BACKGROUND OF THE INVENTION

For the dynamic digital display of pulse information, particularly in the nanosecond range, oscilloscopes or sophisticated testing apparatus which was expensive and required trained operators is normally utilized. Thus no practical method for the display of non-recurring pulse sequences by untrained personnel was available in the art without the use of technically elaborate devices and highly skilled personnel.

SUMMARY OF THE INVENTION

The invention relates to an arrangement for the dynamic direct digital display of pulse characteristics which serves to visually represent the time or amplitude relations of pulse sequences.

Accordingly, it is one of the objects of the invention to provide a readily operable arrangement with simple circuitry for the dynamic direct digital display of pulse characteristics both with regard to time and amplitude. To this end, the invention is characterized in that a delay line L is provided to which a pulse sequence (4-1) is applied, that the delay line L has a minimum length resulting from the product of the signal speed multiplied by the time basis of the pulse sequence, that the signal line is equidistantly tapped, that $n$ sets (2/1, 2/2 ... 2/$n$) of circuits each with $m$ bistable circuits, $m$ AND gates, and $m$ amplifiers are provided, whereby the two inputs of each bistable circuit are connected to a synchronization line S and to the output of an associated AND gate, the two inputs of the AND gate being connected to the synchronization line S and the output of an amplifier associated with the latter AND gate, that the $k$th of all taps of the signal line L is linked with the input of the $k$th amplifier of all sets. The amplitude range of the signal sequence is divisible into $n$ adjacent amplitude intervals whereby the amplifier of the $p$th set generates an output signal for the $p$th amplitude interval only. In the output of each bistable circuit an optical display element is arranged, and all optical display elements are arranged in a field 1 of $n$ lines and $m$ columns, whereby the time and amplitude relations of the wave form of the signal sequences are visually displayed by means of the optical display elements set according to the waveform of the signal sequence at the time of the synchronization or sampling pulses.

In addition to the error analysis normally carried out in a maintenance program, maintenance technicians have to test the time relations of non-recurring or recurring pulse sequences for high-frequency processes, particularly those in the nanosecond range. The present invention also provides for an arrangement for the dynamic direct digital display of pulse time relations, whereby eliminating the amplifiers, only one set of bistable circuits with associated AND gate 3/1 to 3/$m$ is provided, and whereby the pulse width and the pulse spacing of digital pulses is represented by the optical display elements.

The synchronization pulse for triggering the bistable circuits can be initiated either by the leading part of the pulse sequence fed into the signal line or by means of a delay line which is activated by the leading part of the pulse sequence not yet fed into the signal line and which emits a synchronization pulse after the time required for feeding the pulse sequence into the signal line.

It is sometimes desirable to represent the pulse relations of successive pulse sequences. To this end it is advantageous to keep the delay time of the delay circuit variable. If the synchronization pulse is supplied when the pulse sequence to be tested has not been fully fed into the delay line, it is possible to test the pulse relations of that part of the pulse sequence, generally the leading edge of the pulse, which has already been fed into the delay line, as well as the trailing part of the preceding pulse sequence.

The circuitry of the arrangement in accordance with the invention is extremely simple. Equidistantly tapped signal lines, for example, for the nonsecond range, are commercially available. Together with the bistable circuits, the AND gates, and, if necessary, the amplifiers as well as the optical display elements they can take the form of a modular unit. Such modular units can be modularly supplemented at random by changing the time basis of the pulse sequence to be tested, or for the purpose of testing several pulse sequences.

The foregoing and other objects, features and advantages of the invention will be apparent from the following more particular description preferred embodiment of the invention, as illustrated in the accompanying drawings.

DETAILED DESCRIPTION OF THE INVENTION

Figure 1:
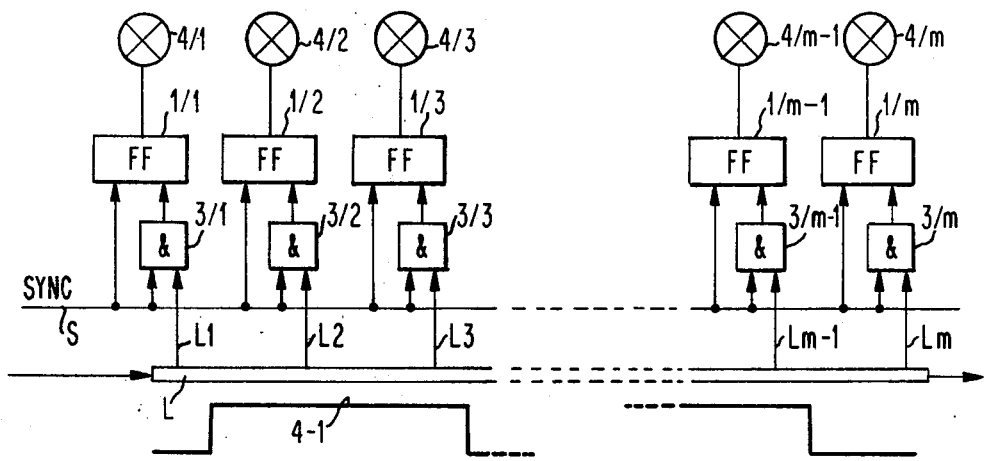
FIG. 1 is a schematic representation of an arrangement for displaying the time relations of a pulse sequence with regard to pulse width and pulse spacing.

FIG. 1 shows an arrangement, by means of which it is possible to permanently visually represent (or freeze) the pulse width and pulse spacing of a digital pulse sequence, such as the one designated as 4-1. To this end the pulse sequence is fed to a delay line L. Delay line L has a minimum length corresponding to the product of signal speed and the time basis of the pulse sequence to be represented. Delay line L is equidistantly tapped. Each of the taps L1 to L$m$ has an associated bistable storage element designated FF 1/1 to FF 1/$m$. Optical display elements 4/1 to 4/$m$ are located on the output of each bistable storage element FF 1/1 to FF 1/$m$. All storage elements have a common synchronization or sample line S. Each bistable storage element is controlled from two inputs: from the input connected to the common synchronization line S and from the output of each of the AND gates 3/1 to 3/$m$ associated with the bistable storage elements. AND gates 3/1 to 3/$m$ each have two inputs, one input from the common synchronization line S and the second from the corresponding tap L1 – L$m$ of the delay line. When the full signal sequence 4-1 has been fed into signal line L and a synchronization pulse is applied, those AND gates 3/2, 3/3, 3/$m$-1 generate an output signal which is associated with delay line taps L2, L3, ... L$m$-1 on which the pulse sequence in the signal line has an amplitude value ≠ 0. This causes the bistable circuits FF 1/2, 1/3, 1/m-1, associated with taps L2, L3, Lm-1 to be controlled via their two inputs comprising the synchronization pulse on line S and the output signal of AND gates 3/2, 3/3, 3/m-1 in such a manner that the associated optical display element 4/2, 4/3, 4/m-1 connected to their outputs are permanently set. This, in turn, causes those optical display elements which are associated with the taps of signal line S on which the pulse sequence applied at the time of the synchronization pulse has an amplitude value of ≠ 0 to light up. Thus, with taps on delay line L arranged closely adjacent to each other, the display elements that light up are representative of the pulse width, whereas the optical display elements that do not light up are representative of the pulse spacing. This status is maintained even after application of the synchronization pulse, thus ensuring that the pulse width/pulse spacing relations are permanently visually displayed.

Figure 4:
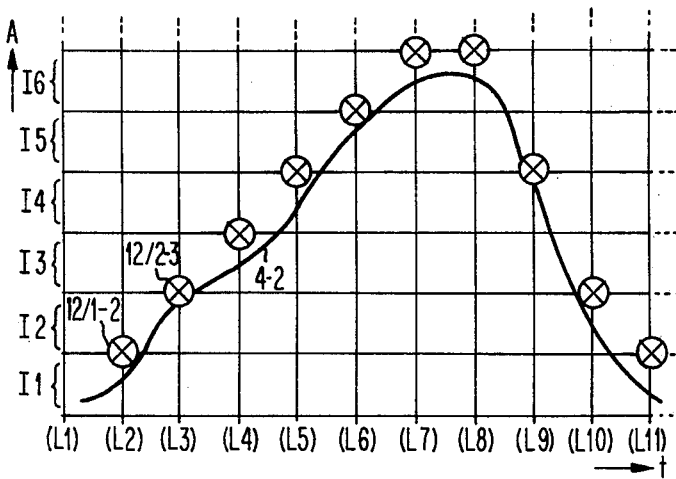
FIG. 4 is a schematic representation of an analogue pulse which by means of the circuit of FIG. 3 is permanently visually displayed (frozen) in accordance with the time and amplitude relations.

In addition to representing the pulse width and pulse spacing relationships, it is also possible to permanently visually display the amplitude relations of a signal, even those of an analogue pulse. To this end the amplitude range of a pulse or pulse sequence is divided into individual adjacent amplitude interval values $I1$, $I2$, $I3$ (FIG. 4). To represent or display such a pulse, a whole field 1 of optical display elements 12/1-1 ... 12/n-n is required. Such a field consists of optical display elements arranged in a matrix of lines and columns. One line comprises as many optical display elements as there are taps on the signal line L. A column, on the other hand, comprises as many optical display elements as there are amplitude intervals.

Figure 2:
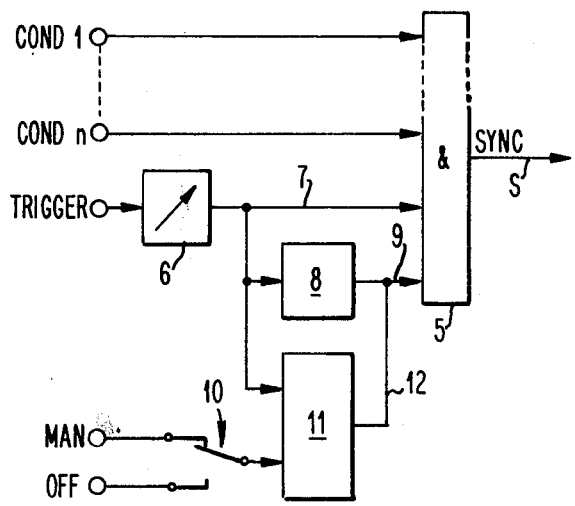
FIG. 2 is a schematic wiring diagram for generating the synchronization pulse for the arrangement of FIG. 1.

FIG. 2 illustrates a schematic wiring diagram for generating the synchronization pulse SYNC for the arrangement of FIG. 1. The synchronization signal SYNC is generated by AND gate 5. AND gate 5 has several inputs: input Cond. 1 to input Cond. n. These conditional inputs carry signals that can be derived from time, logic or other conditions. In addition, AND gate 5 receives a trigger signal via the trigger terminal. This trigger signal can be chosen at random and be derived from a timing oscillator, a machine clock or other machine cycle. Via a delay circuit 6 with variable delay time, this trigger signal is fed on line 7 to AND gate 5. At a delay time of zero, the trigger signal acts directly. At a delay time ranging between the feeding time of the signal sequence into the signal line and time zero, it is possible to analyze the pulse relations in the signal line in a manner which permits testing the last part of the preceding signal sequence and the first part of the current signal sequence.

A special circuit feature permits providing a short, defined synchronization pulse which is derived from the leading edge of the trigger pulse. To this end, the trigger pulse is initially applied to AND gate 5 via delay circuit 6 and line 7, via circuit 8, the input of which is connected to line 7 and whose output forms input 9 of and AND gate 5. AND gate 5 is blocked after a short time designated tsh, so that a short output pulse occurs from AND gate 5 from the beginning of the trigger pulse until time tsh has elapsed. Circuit 8 is a delay line which after a defined time tsh, starting at the beginning of the trigger pulse, generates an output signal blocking AND gate 5.

A further circuit feature permits recurring or non-recurring triggering. For non-recurring triggering, switch 10 is set to manual (man). The beginning of the trigger pulse, provided the switch is set to manual, causes bistable circuit 11 to function in such a manner that an output signal blocking AND gate 5 appears on its output 12. (This bistable circuit has two inputs. The first input is connected to output 7 of delay circuit 6, and the second input from switch 10 which is associated with two terminals manual (man) and off (off) conditioned in accordance with the selection logic). Up to this point in time, the trigger pulse is active via line 7 and AND gate 5. Blocking of the AND gate results in recurring trigger pulses not becoming effective; only the first trigger pulse causes a synchronization pulse SYNC to be generated.

If it is desirable for the synchronization pulses to be generated every time trigger pulses occur, the switch is set to off, so preventing bistable circuit 11 from emitting an output signal blocking AND gate 5.

It is conceivable for switch 11 to be set on or off in predetermined cycles with the aid of electronically controlled supplementary means, so that the display is updated after a certain number of trigger pulses.

Figure 3:
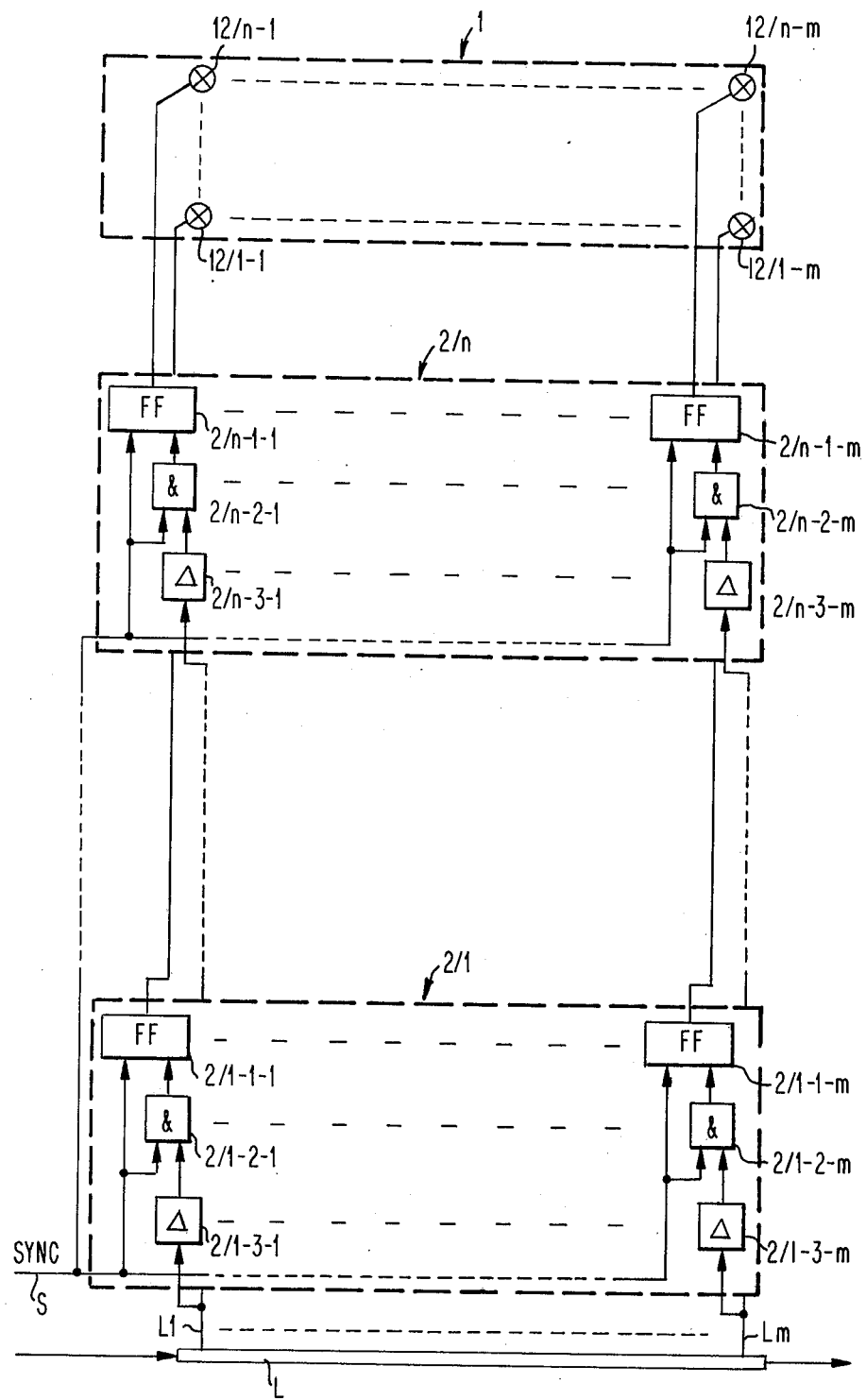
FIG. 3 is a schematic representation of an arrangement for representing a pulse sequence in accordance with the time and amplitude relations.

FIG. 3 illustrates in block logical form an arrangement for representing the duration and amplitude of pulse conditions. The accuracy of the represented or displayed values is higher the more closely adjacent the taps on signal line L are disposed and the shorter the amplitude intervals are. For each amplitude interval, a set of bistable circuits (flip-flops FF) is provided to which an AND gate and an amplifier are connected. Each of these logic systems 2/1 to 2/n comprises as many bistable circuits as there are taps on signal line L. The function of such a bistable circuit with a connected AND gate is the same as that shown in FIG. 1 and previously described relative thereto. Additionally, however, an amplifier is provided between each tap of delay line L and the AND gate. This amplifier generates an output signal only when its input signal falls within the boundaries of a particular amplitude interval. The amplifiers of logic set 2/1 respond to amplitude interval $I1$, and the amplifiers of set 2/2 (not shown) to amplitude interval $I2$. The first tap L1 of delay line L leads both to the input of amplifier 2/1-3-1 of the first set 2/1, and to the input of amplifier 2/2-3-1 of the second set 2/2 (not shown) as well as to the input of amplifier 2/n-3-m of set 2/n. The output of amplifier 2/1-3-1 leads to one input of AND gate 2/1-2-1 whose other input is connected to synchronization line S. The output of AND gate 2/1-2-1 forms one input of the bistable circuit 2/1-1-1 whose second input is also connected to synchronization line S. The optical display element 1 2/n-1 in display field 1 is connected to the output of the bistable circuit 2/1-1-1. The above description applies analogously to all other bistable circuits with a connected AND gate and amplifier for sets 2/2 (not shown) to set 2/n both in the column direction 1 to n and the line direction 1 to m (n = number of sets; m = number of taps on the signal line).

Thus, for example, tap L1 of delay line L leads to amplifier 2/n-3-1 whose output is connected to one input of AND gate 2/n-2-1; the second input of said AND gate is connected to synchronization line S. The output of AND gate 2/n-2-1 forms one input of the bistable circuit 2/n-1-1 whose second input is linked with synchronization line S. The optical display element 1 2/1-1 in display field 1 is arranged in the output of the bistable circuit 2/n-1-1.

Tap Lm leads to amplifier 2/1-3-m of set 2/1, to amplifier 2/2-3-m of set 2/2 (not shown) up to amplifier 2/n-3-n of set 2/n. The output of amplifier 2/1-3-m leads to one input of AND gate 2/1-2-m whose other input is connected to synchronization line S. The output of AND gate 2/1-2-m leads to one input of the bistable circuit 2/1-1-m whose second input is connected to synchronization line S. The optical display element 1 2/n-m in display field 1 is connected to output of the bistable circuit 2/m-1-m.

The output of amplifier 2/n-3-m is connected to one input of AND gate 2/n-2-m whose second input is connected to synchronization line S. The output of AND gate 2/n-2-m is connected to one input of the bistable circuit 2/n-1-m whose second input is connected to synchronization line S. The optical display element 1 2/n-m is display field 1 is located in the output of the bistable circuit 2/n-1-m.

FIG. 4 shows a graph 4-2 of an analogue pulse whose time and amplitude relations are to be permanently visually display in display field 1. To relate this signal course to the taps and the amplitude intervals, the taps are shown as vertical adjacent lines and the amplitude intervals as horizontal superimposed lines. The optical display elements 1 2/1-1 to 1 2/n-m are arranged at the crossover points vertical and horizontal lines. FIG. 4 shows only those optical display elements which are set to display the time and amplitude of the signal wave form. Display indicator 1 2/1-2 is turned on since an amplitude value occurs on tap L2 during the interal I1, to which amplitude 2/1-3-2 connected to the second bistable circuit 2/1-1-2 of set 2/1 (not shown) responds. Optical display element 1 2/2-3 is set because the amplitude value occurs on tap L3 in amplitude interval I2. Amplifier 2/2-3-3 (not shown) of the bistable circuit 2/2-1-3 in set 2/2 responds to the latter amplitude interval.

The circuit of FIG. 3 may be simplified: for example, the amplifiers of a column, which are connected to the same tap of signal line L but which respond to different amplitude intervals, may be combined in the form of only one amplifier with only one input but n outputs for the different amplitude intervals. It is also possible to display negative amplitude values by extending the amplitude interval system to negative amplitude values and by adapting orthodox amplifiers accordingly.

While the invention has been particularly shown and described with reference to a preferred embodiment thereof, it will be understood by those skilled in the art that various changes in form and detail may be made therein without departing from the spirit and scope of the invention.

What is claimed is:

1. An arrangement for the dynamic digital display of predetermined characteristics of a high frequency pulse train wherein a pulse sequence is applied to an equidistantly tapped delay line, comprising in combination a plurality of sets of bistable circuits, logic AND gates and amplifiers, the taps of said delay line being connected to the input of the associated amplifiers of all said sets, wherein the amplitude range of said pulse sequence is divisible into adjacent amplitude intervals whereby the amplifier of each of said sets generates an output signal only when an input of a predetermined level is provided from said delay line, a matrix of display indicators, said matrix of display indicators being arranged in a configuration of horizontal lines and vertical columns, and means responsive to a synchronizing pulse applied to the synchronizing line comprising one of said inputs to said bistable circuits for indicating the duration, spacing and amplitude characteristics of the signals in said pulse sequence said means including said indicator configuration in which said indicators are selectively energized in accordance with said characteristics of said pulse sequence at the time of said synchronization pulse.

2. An arrangement as described in claim 1 wherein the second input to said bistable circuit comprises the output of the associated logical and gate, and wherein the two inputs to said logical and gate comprise the synchronization signal line and the signal from said associated amplifier.

3. Arrangement for the dynamic direct digital display of pulse relations, characterized in that a signal line L is provided to which a pulse sequence 4-2 is applied, that the signal line L has a minimum length resulting from the product of the signal speed multiplied by the time basis of the pulse sequence, that the signal line is equidistantly tapped, that $n$ sets (2/1, 2/2 ... 2/n) each with $m$ bistable circuits (2/1-1-1 ... 2/1-1-m, 2/2-1-1 ... 2/2-1-m, ..., 2/n-1-1 to 2/n-1-m), $m$ AND gates (2/1-2-1 to 2/1-2-m; ...; 2/n-2-1 to 2/n-2-m), and $m$ amplifiers (2/1-3-1 to 2/1-3-m; ...; 2/m-3-; to 2/n-3-m) are provided, whereby the two inputs of each bistable circuit (2/p-1-k; $p = 1$, 2 to $n$; $k = 1$, 2 to $m$) are connected to the synchronization line S and to the output of the AND gate (2/p-2-k; $p=1$, 2 to $n$; $k = 1$, 2 to $m$) associated with it, and the two inputs of the AND gate (2/p-2-k; $p = 1$, 2 to $n$; $k = 1$, 2 to $m$) are connected to the synchronization line S and the output of an amplifier (2/p-3-k; $p = 1$, 2 to $n$; $k = 1$, 2 to $m$) associated with the latter AND gate, that the $k$th ($k = 1$, 2 to $m$) of all taps L1, L2 to L$m$ of the signal line L is linked with the input of the $k$th ($k = 1$, 2 to $m$) amplifier of all sets (2/1, 2/2 to 2/n), that the amplitude range of the signal sequence 4-2 is divisible into $n$ adjacent amplitude interval I1, I2 to I$n$, that by means of the amplifier of the $p$th set ($p = 1$, 2 to $n$) an output signal is generatable for the $p$th amplitude interval only ($p = 1$, 2 to $n$), that in the output of each bistable circuit (2/p-1-k; $p = 1$, 2 to $n$; $k = 1$, 2 to $m$) an optical display element (1 2/p-k; $p = 1$, 2 to $n$; $k = 1$, 2 to $m$) is arranged, and that all optical display elements (1 2/1-1 to 1 2/n - m) are arranged in a field 1 of $n$ lines and $m$ columns, so that the time and amplitude relations of the wave form of the signal sequence (4/2) are permanently visually displayed by means of the optical display elements set according to the wave form of the signal sequence (4/2) at the time of the synchronization pulse.

4. Arrangement in accordance with claim 3, characterized in that only one set ($n=1$) of bistable circuits (1/1 to 1/m to which an associated AND gate (3/1 to 3/m) is connected, is required for determination of the pulse width and the pulse spacing characteristics of digital pulses which are displayed by selective energization of said optical display elements.

5. Arrangement in accordance with claim 3, characterized in that for generating the synchronization pulse, a delay circuit (6) to be activated before the beginning of the pulse sequence is provided, and that the synchronization pulse is generatable after the pulse sequence has been partly or fully fed into the pulse line (L).

6. Arrangement in accordance with claim 3, characterized in that the delay time of the delay circuit (6) is variable, so that at the ratio delay time shorter than the time basis of the pulse sequence, for successive pulse sequences the pulse relations of the last part of a preceding pulse sequence and the first part of the subsequent pulse sequence can be observed.

7. Arrangement in accordance with claim 3, characterized in that for generating a short synchronization pulse, and AND gate (5) is provided which is activated by a trigger pulse on a first input line (7), and that to block the AND gate, a circuit (8) generates a blocking signal on a further input line (9) after a short time starting with the emission of the trigger pulse.

8. Arrangement in accordance with claim 3, characterized in that for the recurring or non-recurring generation of a synchronization signal, the AND gate (5) with its input line (7) carrying the trigger pulse is controllable via the output (12) of a bistable circuit (11), whereby the bistable circuit (11) is controllable by means of the trigger signal on the one hand and externally, for predeterminined periods of time, for the generation of a blocking signal on the other.

* * * * *